(12) United States Patent
Poon et al.

(10) Patent No.: US 12,297,069 B2
(45) Date of Patent: May 13, 2025

(54) ELECTRONIC COMPONENT PACKING REEL

(71) Applicant: NEXPERIA B.V., Nijmegen (NL)

(72) Inventors: King Fai Poon, Nijmegen (NL); Tin Ho Wong, Nijmegen (NL); Fei Ying Wong, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 208 days.

(21) Appl. No.: 18/147,045

(22) Filed: Dec. 28, 2022

(65) Prior Publication Data

US 2023/0211975 A1 Jul. 6, 2023

(30) Foreign Application Priority Data

Dec. 31, 2021 (EP) .................................... 21218426

(51) Int. Cl.
*B65H 75/02* (2006.01)
*G11B 23/027* (2006.01)

(52) U.S. Cl.
CPC ........... *B65H 75/02* (2013.01); *G11B 23/027* (2013.01); *B65H 2701/53* (2013.01)

(58) Field of Classification Search
None
See application file for complete search history.

(56) References Cited

U.S. PATENT DOCUMENTS

| | | | | |
|---|---|---|---|---|
| 1,108,855 A | * | 8/1914 | Simons ................... | B65H 75/18 242/600 |
| 2,585,999 A | * | 2/1952 | Bunch ................ | B65H 75/2218 242/610.6 |
| 2,615,643 A | * | 10/1952 | Barsam, Jr. .......... | G03B 21/321 242/597.2 |
| 2,775,418 A | * | 12/1956 | Cadman ............. | B65H 75/2281 242/125.1 |
| 3,784,120 A | * | 1/1974 | Harris ..................... | B65H 54/46 29/445 |
| 4,340,188 A | * | 7/1982 | Derendorf ............ | G11B 23/037 206/394 |

(Continued)

FOREIGN PATENT DOCUMENTS

| | | |
|---|---|---|
| JP | H07187517 A | 7/1995 |
| WO | 2013151013 A1 | 10/2013 |

OTHER PUBLICATIONS

Extended European Search Report for corresponding European application EP21218426.1, 10 pages dated Jun. 22, 2022.

*Primary Examiner* — William A. Rivera
(74) *Attorney, Agent, or Firm* — Ruggiero McAllister & McMahon LLC

(57) ABSTRACT

The disclosure relates to an electronic component packing reel for a tape and reel packaging system and the electronic components are supported in pockets of a carrier tape wound around the reel, the packing reel includes: a central hub; two wall elements attached on both sides of the centrale hub defining a retaining space for retaining the carrier tape wound around the central hub; a hub insert arranged for placement of the hub insert over the central hub, the hub insert having an outer rim diameter for increasing a diameter of the central hub, and the hub insert includes at least two sections having mating locking means for interlocking the sections upon placement of the hub insert over the central hub.

19 Claims, 2 Drawing Sheets

(56) References Cited

U.S. PATENT DOCUMENTS

| | | | | |
|---|---|---|---|---|
| 6,123,286 A * | 9/2000 | Garcia | ............... | H05K 13/0421 |
| | | | | 242/532.6 |
| 8,439,292 B2 * | 5/2013 | Goh | .................... | H05K 13/021 |
| | | | | 242/532.6 |
| 9,670,032 B1 * | 6/2017 | Watkins | ................. | B65H 75/18 |
| 2003/0234316 A1 * | 12/2003 | Sloan | ................... | E04H 17/266 |
| | | | | 242/573.9 |

* cited by examiner

ELECTRONIC COMPONENT PACKING REEL

CROSS-REFERENCE TO RELATED APPLICATIONS

This application claims the benefit under 35 U.S.C. § 119(a) of European Application No. 21218426.1 filed Dec. 31, 2021, the contents of which are incorporated by reference herein in their entirety.

BACKGROUND

1. Field of the Disclosure

The present disclosure relates to a system of an electronic component packing reel and a hub insert and a method of use of such electronic component packing reel.

2. Description of the Related Art

In the electronic industry small electronic components such as semiconductor chips or Surface Mounted Devices, SMD, are often packed in tape and reel packing systems. Tape and reel packing has many advantages since it provides a robust, suitable and relatively cheap way of packing such electronic components for automated placement of these components on for example Printed Circuit Boards.

Tape and reel packaging is one of the most preferred ways of packing such components for automated placement. In tape and reel packaging the components are supported or carried in pockets of a carrier tape which tape is wound into the packing reel. Such packing reels are defined by several standards such as the Industrial standard, IEC60286-3 & EIA481. These standards define a standard length requirement for the leader and trailer of tape and reel packaging systems. Because of the leader length, the component marking is often covered by the leader tape length.

Typically, production processes require final product verification of some or more likely, each of the packing reels before these reels are packed into a box. The verification of several details of the packing reel need to be checked according to requirement. One of the things that need to be checked is if the taped products match the label information on the packaging reel. Also the component marking and label information is to be checked. As the component marking is covered by the leader length, the quality check cannot be done easily. Operators first have to manually partly unwind the carrier tape from the packaging reel and then check, manually, if the labels match. This is cumbersome, labour-intensive and does not allow automatic quality control. As such, there is a need for a tape and reel packaging solution which is more convenient, less labour-intensive, and does allow a more automated quality control, which solution meets the requirements of the industry standards for reel and packing as mentioned above.

SUMMARY

In a first aspect, there is provided an electronic component packing reel for a tape and reel packaging system wherein said electronic components are supported in pockets of a carrier tape wound around said reel, said packing reel comprising;
  a central hub;
  two wall elements attached on both sides of said centrale hub defining a retaining space for retaining said carrier tape wound around said central hub;
  a hub insert arranged for placement of said hub insert over said central hub, said hub insert having an outer rim diameter for increasing a diameter of said central hub, wherein said hub insert comprises at least two section having mating locking means for interlocking said sections upon placement of said hub insert over said central hub.

Electronic components may be packed in tape and reel packaging systems wherein these electronic components are supported, fixed, but typically loosely placed in pockets of a carrier tape. The carrier tape is wound around the reel and may have a pattern of perforations in the tape on both sides of the pocket, for ease of detaping the tape.

The components are placed in specifically designed pockets which may be embossed in a plastic carrier tape. The tape may be sealed with a cover tape to prevent the components from escaping the pockets. Once the components are placed in the pockets and the tape is preferably sealed, the tape is wound onto a rigid reel which may be manufactured from rigid plastic to provide sufficient mechanical strength and protection upon handling, transport and storage of the tape.

The packaging reel is defined by industrial standards and comprises a central hub, for winding the tape, and two wall elements attached on both sides of the centrale hub. With the central hub and the wall elements, a retaining space is defining for retaining the carrier tape and for winding it around the central hub.

Quality control requires certain checks on some or more typically, all of the packaging reels. One of the things that need to be checked before the packaging reel is packed into a packaging box, is to see if the component marking and label information are correct and match. As the component marking is covered by the leader length the quality control cannot be performed easily and operators have to unwind the carrier tape for manual checking the labels, after which the tape has to be wind again around the central hub and packed for further processing.

The leader and trailer in tape and reel packaging systems are the starting portions and the ending portions of the reel. These portions do not contain electronic components and are used for the initial feeding of the tape into the assembly line. These portions free of components ensure that the final loaded pockets can be transported safely in the assembly process.

The inventors found out that whether the component marking is covered by the leader tape length depends on the hub size, package size (or carrier tape pocket size) and packing quantity. It has been found that, this problem occurred, after tape winding, if the outer carrier tape perimeter of diameter exceeds 400 mm, then the component marking can be seen.

Accordingly, the packaging reel according to the present disclosure provides a hub insert which increased the hub diameter to ensures that the component marking can be seen by operators or by automatic detection sensors or devices, without de-winding. Hence, with the proposed packaging reel, the inspection can be done in an automated way in the auto-packing line by enabling the OCR function of the machine. The hub insert is suitable for retro-fitting known packaging reels which allow the use of convention packaging reels which meet the requirements of the above mentioned industrial standards, but with the use of the proposed hub insert, a tape and reel packaging solution is provided which is more convenient, less labour-intensive, and does allow automated quality control by OCR of the label.

In an example, the hub insert is annular disc shaped and consisting of two similar sections having mating locking means for interlocking said sections. The effect of the two sections is that this makes the placement of the hub insert easier.

In an example, said hub insert has an annulus area selected in accordance with a length of said carrier tape to be wound around said packing reel. Since the tape may have a particular typical length, the combination of the this typical length and the central hub diameter defines whether or not the component marking can be seen or read, manually or automatically, without unwinding of the tape. Such is the case if the outer perimeter or circumference of tape in wound condition, is above 400 mm in length. As is may be know what the length of the tape is, and the diameter of the central hub is also known, a hub insert may be selected to increase the hub diameter to meet the above mentioned minimum of 400 mm requirement. As such, multiple hub inserts with multiple annular area may be selected accordingly.

In an example, one of said sections of said hub insert comprises a locking member located at the inner rim of said hub insert and protruding radially inward, wherein said locking member has a shape mating a slot in the outer rim of said central hub. With the locking member or finger the insert may be fixed onto the packing reel which ensures the correct assembly orientation.

In an example, one of said sections of said hub insert comprise a fixing anchor, preferably provided on a locking member located at the inner rim of said hub insert and protruding radially inward, for locking rotational displacement of said hub insert with respect to said central hub. With such a fixing means or fixing anchor the inner slot of the hub may be anchored or locked to prevent the hub insert from turning during carrier tape winding and de-winding.

In an example, said hub insert comprise plural coaxial annular discs for increasing said diameter of said central hub with each of said coaxial annular discs. Several annular discs may be used which are positioned with respect to each other in an coaxial manner such that with each disc the outer hub diameter is increased accordingly.

In an example, said hub insert comprises plural coaxially attached annular discs, wherein said discs can be separated from each other through pre-cut lines between two coaxial annular discs. Each annular disc may be removed or detached or separated by use of these pre-cut lines or other means to ease the removal of a particular disc, by which the outer hub diameter decreases to a degree which corresponds with the desired hub diameter.

In an example, the hub insert comprises a tape slot at an outer diameter of said hub insert, for insertion of said carrier tape.

In an example, said hub insert comprises a tape block slot at an outer diameter of said hub insert, for preventing insertion of said carrier tape.

In a second aspect, there is provided a method of winding a carrier tape on an electronic component packing reel, wherein said electronic component packing reel is arranged for a tape and reel packing system wherein said electronic components are supported in pockets of said carrier tape wound around said reel, said method comprising the steps of:
  determining the length of the carrier tape;
  providing the packing reel;
  determining a central hub diameter of said packing reel;
  attaching a hub insert over said central hub, when it is determined that the circumferential diameter of the tape, in the condition in which the tape is wrapped around said central hub, is less than 400 mm, for increasing a diameter of said central hub, and wherein said hub insert comprises at least two section having mating locking means for interlocking said sections upon placement of said hub insert over said central hub.

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

BRIEF DESCRIPTION OF DRAWINGS

The disclosure will now be described in a non-limiting way with reference to the accompanying drawings in which like parts are indicated by like reference symbols and which drawing show in.

DETAILED DESCRIPTION

The present disclosure is described in conjunction with the appended figures. It is emphasized that, in accordance with the standard practice in the industry, various features are not drawn to scale. In fact, the dimensions of the various features may be arbitrarily increased or reduced for clarity of discussion.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

Figure 1:
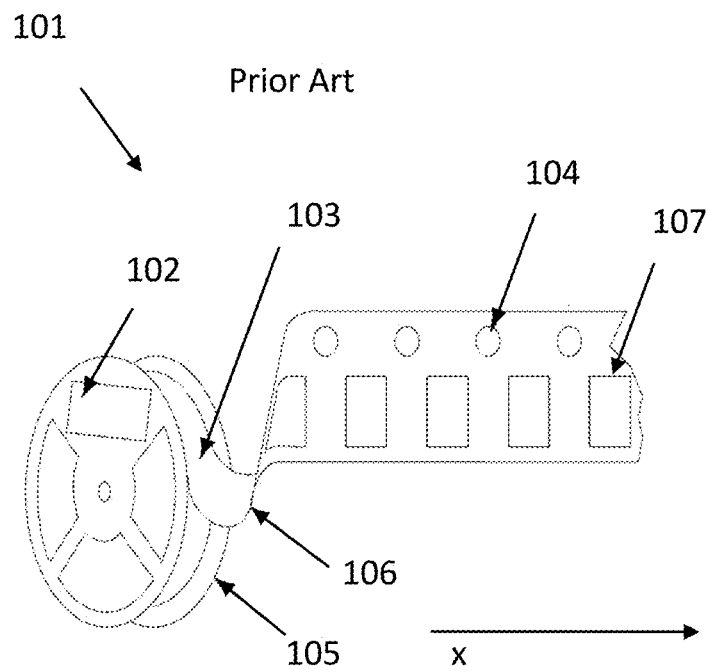
FIG. 1 shows a first perspective view of a conventional packing reel for a tape and reel packaging system, having a carrier tape would partially around said reel.
Figure 2:
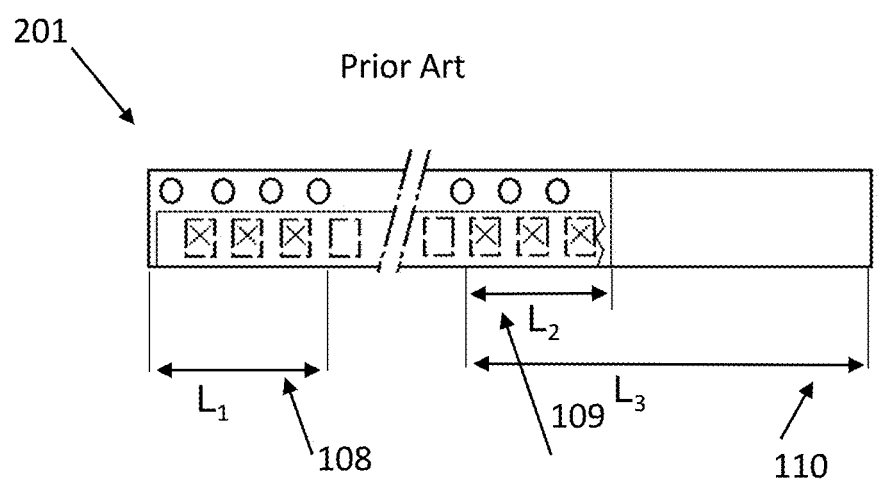
FIG. 2 shows a carrier tape for winding around a packaging reel.

In FIGS. 1 and 2 a conventional electronic component packing reel 101 and carrier tape 201 are shown for a tape and reel packaging system wherein the electronic components are supported in pockets of a carrier tape, wound around the packaging reel.

The packing reel 101 can be used to transport, package, store and ease the manual and more typically automated placement of electronic components such as chips, semiconductor components, Surface Mounted Devices, SMDs, and small or miniaturized components. The packaging reel 101 of a tape and reel packing system has the advantage of being a robust, suitable and relatively cheap way of packing such components for automated placement of these components on for example Printed Circuit Boards.

The packaging reel 101 shown in FIG. 1 is a typical reel according to an industrial standard such as the IEC60286-3

& EIA48. The tape 103, 106 has an upper tape side indicated with the arrow of 103 and a bottom tape side indicated with the arrow of 106. The tape or carrier tape 103, 106 is wound around the packaging reel 105 or reel for short. Each reel 105 contains a label 102 on which the information is provided with respect to the components packaged by or within the cavities 107 of the packaging tape or also known as or referred as carrier tape 103, 106.

To facilitate the winding and unwinding or known as reeling or unreeling, of the carrier tape 103, 106, the tape is provided with sprocket holes 104 to drive the reeling of the carrier tape 103, 106 and unreeling thereof in an unreeling direction x.

The tape and reel packaging systems are typically used as a preferred type of packing electronic components for automated placement. In tape and reel packaging, the standards define standard length requirement for the leader 110 and trailer 108 of tape and reel packaging. The trailer 108 length L1 is for example a minimum of 160 mm whereas the leader 110 length is a minimum of 400 mm whereas the length of L2, 109 is minimum 100 mm.

Because of the leader length, the component marking is covered by the leader tape length. In production line, there is typically a requirement to have a final product verification or quality check before packing the reel into a packing box. The verification is to check if the components in the pockets 107 of the carrier tape 103, 106 match the label information 102 before putting them into a packing box. It is required to check if the component marking 109 and label information 102 correspond.

As mentioned, if the component marking 109 is covered by the leader length 110, then the quality check cannot be done easily. Operators have to de-wind the carrier tape 103, 106 and check manually, and then wind-up the carrier tape 103, 106 for packing.

Whether the component marking is covered by leader tape length depends on the size of the central hub, the package size (or carrier tape pocket size 107) and packing quantity. After tape winding, if the outer carrier tape perimeter is more 400 mm, then the component marking can be seen.

Figure 3:
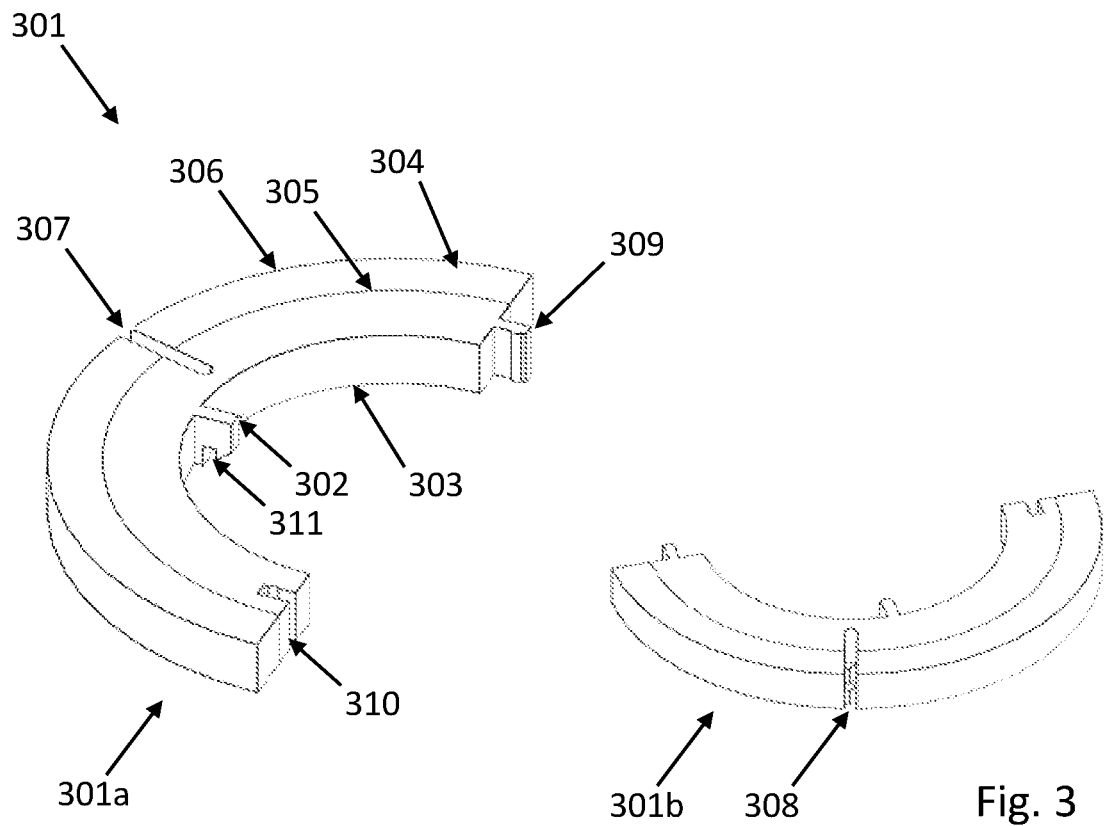
FIG. 3 shows a hub insert according to an aspect of the present disclosure for placement over a central hub of a packaging reel as shown in FIGS. 1 and 2.

In FIG. 3 a hub insert 301 is shown according to the present disclosure by which the disadvantages of the known packaging reels 105 are solved.

The hub insert 301 shown in FIG. 3 comprises two similarly shaped mating section 301a, 301b. The skilled person will appreciate that the hub insert 301 may also comprises more than two sections, and that the section may have different shapes. In other words, the sections may together form an annular disc shaped profile wherein the annular disc may be divided into two, three, four, five, or more sections covering different sized disc segments.

With the hub insert 301 the central hub, around which typically the carrier tape 103, 106 would be wound, will be increased to ensure that the component marking can be seen by operators without de-winding. Accordingly, the inspection can also be done in the Auto-packing line automatically by enabling an OCR function of the machine. This will result in a reduction in time spent on performing manual quality inspection.

The known packaging reel 105 comprises a central hub, as mentioned, and further also wall element as shown in FIG. 1. The two wall elements are attached on both sides of the centrale hub and define a retaining space for the carrier tape 105 to be wound around the central hub.

With the hub insert shown in FIG. 3, an adjustable hub diameter is achieved as by adding the an insert into the inner core of the packing reel 105, the hub diameter of the packing reel 105 can then be changed and increased. With this increased hub diameter reel, the outer perimeter of the carrier tape can then meet the 400 mm minimum requirement, as indicated in FIG. 2 and the component marking can be easily seen and inspected without de-winding the carrier tape. This also enable automatic vision inspection and quality checking.

The hub insert 301 consists of two substantially identical sections 301a, 301b and may have several coaxial disc sections which may be separated from each other by a pre-cut line 305 for quick removal of the outer rim 304. The hub insert has an inner surface 303 to match the out diameter of the central hub. With the removable outer rim 304 the hub diameter is changed and increased to the diameter of the outer rim 306 which acts as the new hub diameter.

To ensure that both sections 301a, 301b remain attached or fixed after placement over the central hub, both sections have preferably mating locking means 309, 310, on both free ends of the sections.

The hub insert may further comprise a self-locking finger 310 to fix the insert 301 onto the packaging reel and to ensure that the assembly orientation is correct. The hub insert 301 may further comprises an anchor 302 to the inner slot of the hub 301, to prevent the hub insert 301 from turning during carrier tape winding and de-winding. In FIG. 3 the hub insert 301 further shows a tape slot 307 to insert the tape therein, and shows a tape block 308 to prevent incorrect insertion of the carrier tape.

a hub insert arranged for placement of said hub insert over said central hub, said hub insert having an outer rim diameter for increasing a diameter of said central hub, wherein said hub insert comprises at least two section having mating locking means for interlocking said sections upon placement of said hub insert over said central hub.

Figure 4:
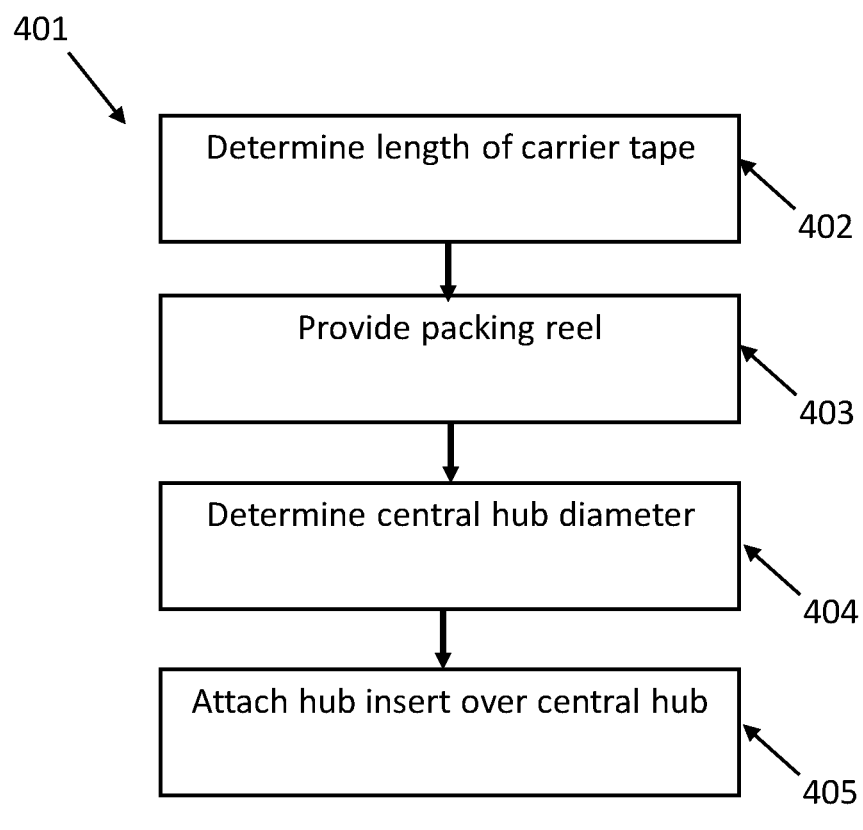
FIG. 4 shows a flow chart of the steps of a method of winding a carrier tape on an packaging reel according to another aspect of the present disclosure.

FIG. 4 shown the flowchart of several steps of a method 401 of winding a carrier tape on an electronic component packing reel, wherein the electronic component packing reel is arranged for a tape and reel packing system wherein the electronic components are supported in pockets of the carrier tape wound around the reel. The method comprises the steps of:

determining 402 the length of the carrier tape;
providing 403 the packing reel;
determining 404 a central hub diameter of said packing reel; and
attaching 405 a hub insert over said central hub, when it is determined that the circumferential diameter of the tape, in the condition in which the tape is wrapped around said central hub, is less than 400 mm, for increasing a diameter of said central hub, and wherein said hub insert comprises at least two section having mating locking means for interlocking said sections upon placement of said hub insert over said central hub.

The ensuing description above provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including combinations of features from different embodiments, without departing from the scope of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or" in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the description above, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

The techniques introduced herein can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions. The machine-readable medium includes non-transitory medium, where non-transitory excludes propagation signals. For example, a processor can be connected to a non-transitory computer-readable medium that stores instructions for executing instructions by the processor.

What is claimed is:

1. A system of an electronic component packing reel and a hub insert for a tape and reel packaging system wherein the electronic components are supported in pockets of a carrier tape wound around the reel, the packing reel comprising:
a central hub;
two wall elements attached on both sides of the central hub defining a retaining space for retaining the carrier tape wound around the central hub,
wherein the hub insert is arranged for placement over the central hub, the hub insert having an outer rim diameter for increasing a diameter of the central hub, wherein the hub insert comprises at least two sections configured to interlock the sections upon placement of the hub insert over the central hub, and wherein the hub insert has an annular area selected in accordance with a length of the tape to be wound around the packing reel to allow visual inspection without de-winding of the carrier tape.

2. The system of an electronic component packing reel according to claim 1, wherein the hub insert is annular disc shaped and consisting of two similar sections configured to interlock the sections.

3. The system of an electronic component packing reel according to claim 2, wherein the hub insert has an annulus area selected in accordance with a length of the carrier tape to be wound around the packing reel.

4. The system of an electronic component packing reel according to claim 2, wherein one of the sections of the hub insert comprises a locking member located at the inner rim of the hub insert and protruding radially inward, and wherein the locking member has a shape mating a slot in the outer rim of the central hub.

5. The system of an electronic component packing reel according to claim 2, wherein one of the sections of the hub insert comprises a fixing anchor provided on a locking member located at the inner rim of the hub insert and protruding radially inward, for locking rotational displacement of the hub insert with respect to the central hub.

6. The system of an electronic component packing reel according to claim 2, wherein the hub insert comprises a plurality of coaxial annular discs for increasing the diameter of the central hub with each of the coaxial annular discs.

7. The system of an electronic component packing reel according to claim 2, wherein the hub insert comprises a plurality of coaxially attached annular discs, wherein the discs can be separated from each other through pre-cut lines between two coaxial annular discs.

8. The system of an electronic component packing reel according to claim 2, wherein the hub insert comprises a tape slot at an outer diameter of the hub insert, for insertion of the carrier tape.

9. The system of an electronic component packing reel according to claim 2, wherein the hub insert comprises a tape block slot at an outer diameter of the hub insert, for preventing insertion of the carrier tape.

10. The system of an electronic component packing reel according to claim 2, wherein the sections of the hub insert together form an annular disc shaped profile.

11. The system of an electronic component packing reel according to claim 1, wherein one of the sections of the hub insert comprises a locking member located at the inner rim of the hub insert and protruding radially inward, and wherein the locking member has a shape mating a slot in the outer rim of the central hub.

12. The system of an electronic component packing reel according to claim 1, wherein one of the sections of the hub insert comprises a fixing anchor provided on a locking member located at the inner rim of the hub insert and protruding radially inward, for locking rotational displacement of the hub insert with respect to the central hub.

13. The system of an electronic component packing reel according to claim 1, wherein the hub insert comprises plural coaxial annular discs for increasing the diameter of the central hub with each of the coaxial annular discs.

14. The system of an electronic component packing reel according to claim 1, wherein the hub insert comprises a plurality of coaxially attached annular discs, wherein the discs can be separated from each other through pre-cut lines between two coaxial annular discs.

15. The system of an electronic component packing reel according to claim 1, wherein the hub insert comprises a tape slot at an outer diameter of the hub insert, for insertion of the carrier tape.

16. The system of an electronic component packing reel according to claim 1, wherein the hub insert comprises a tape block slot at an outer diameter of the hub insert, for preventing insertion of the carrier tape.

17. The system of an electronic component packing reel according to claim 1, wherein the sections together form an annular disc shaped profile.

18. A method of winding a carrier tape on an electronic component packing reel, wherein the electronic component packing reel is arranged for a tape and reel packing system and wherein the electronic components are supported in pockets of the carrier tape wound around the reel, the method comprising the steps of:
    determining the length of the carrier tape;
    providing the packing reel;
    determining a central hub diameter of the packing reel;
    attaching a hub insert over the central hub, when it is determined that the circumferential diameter of the tape, in the condition in which the tape is wrapped around the central hub, is less than 400 mm, for increasing a diameter of the central hub.

19. The method of claim 18, wherein the hub insert comprises at least two sections configured to interlock the sections upon placement of the hub insert over the central hub.

\* \* \* \* \*